(12) United States Patent
Belley et al.

(10) Patent No.: US 10,720,753 B2
(45) Date of Patent: Jul. 21, 2020

(54) LIGHT EMITTING ASSEMBLY AND METHOD THEREOF

(71) Applicant: BAE SYSTEMS INFORMATION AND ELECTRONIC SYSTEMS INTEGRATION INC., Nashua, NH (US)

(72) Inventors: David B. Belley, Dunstable, MA (US); Erik J. Spahr, Hollis, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 59 days.

(21) Appl. No.: 16/101,674

(22) Filed: Aug. 13, 2018

(65) Prior Publication Data
US 2020/0052461 A1   Feb. 13, 2020

(51) Int. Cl.
*H01S 5/024* (2006.01)
*H01S 5/022* (2006.01)
*G02B 6/42* (2006.01)

(52) U.S. Cl.
CPC ........ *H01S 5/02415* (2013.01); *G02B 6/4204* (2013.01); *G02B 6/4225* (2013.01); *H01S 5/02252* (2013.01); *H01S 5/02268* (2013.01)

(58) Field of Classification Search
CPC ............. H01S 5/02415; H01S 5/02469; H01S 5/02476; H01S 5/02268; H01S 5/02252; H01S 5/02423; G02B 6/4204; G02B 6/4225
See application file for complete search history.

(56) References Cited

U.S. PATENT DOCUMENTS

| | | | |
|---|---|---|---|
| 4,752,109 A | 6/1988 | Gordon et al. | |
| 5,065,226 A * | 11/1991 | Kluitmans | H01S 5/02248 257/433 |
| 2005/0185898 A1* | 8/2005 | Stewart | G05D 23/1919 385/92 |
| 2015/0023377 A1* | 1/2015 | Shastri | H01S 5/02415 372/36 |

* cited by examiner

*Primary Examiner* — Armando Rodriguez
(74) *Attorney, Agent, or Firm* — Sand, Sebolt & Wernow LPA; Scott J. Asmus

(57) ABSTRACT

A mount connects a light emitting device, such as a laser diode assembly, to an optical bench. The mount may include a thermoelectrical module coupled to a sub-element of a heat exchanger extending through an opening formed in the optical bench. The thermoelectrical module acts as a heat sink to draw heat outwardly from the laser diode and cool the same. The heat sink enables the laser diode to transmit heat thereto such that substantially all of the heat generated by the laser diode sinks to the heat exchanger. As such, the laser diode transfers virtually no heat to the optical bench so the optical bench is free of deflections or distortions resultant from the heat generated during generation of the laser beam.

18 Claims, 6 Drawing Sheets

LIGHT EMITTING ASSEMBLY AND METHOD THEREOF

BACKGROUND

Technical Field

The present disclosure relates generally to a light emitting assembly, More particularly, the present disclosure relates to a mount for a light emitting device incorporating a heat exchanger. Specifically, the present disclosure relates to thermoelectric modules coupled to a heat exchanger to either warm or cool the light emitting device, which may be a laser.

Background Information

Light emitting devices, such as laser diodes, typically operate within a narrow set of tolerances. The tolerances relate to a temperature operating range and a narrow set of deflection angles. Laser diodes are often mounted to an optical bench. Laser diodes emit heat during the generation of a laser beam. Due to the direct mounting of the laser diode to the optical bench, some heat generated by the diode may be transferred to the optical bench. The heat transfer from the laser diode to the optical bench may occur by conduction, convection, radiation, or another type of non-conduction, non-convection, and non-radiation manner.

When the optical bench heats or cools it can deflect (either through expansion or contraction) based on the coefficient of thermal expansion associated with the material forming the optical bench. If the optical bench expands or contracts, it may negatively affect the performance of the light emitting device because the deflection of the optical bench may cause the laser diode to move outside of its preferred operating tolerances.

In military applications, laser systems require tightly controlled laser beam point tolerances. Laser sources are evolving such that semiconductor based lasers are being considered for direct output coupling of their beams, which requires tight control over the laser's pointing, especially from factors related to thermal effects. Often, diodes are fiber coupled. There may be heavy heat load of the laser diode package/assembly that can be controlled in a thermally isolated region of the system. There are certain applications, however, where direct diode light must be utilized and a fiber coupling system is not practical.

SUMMARY

Issues continue to exist with light emitting devices that are connected to an optical bench. Namely, heat transfer from the light emitting device can cause the optical bench to expand or contract which may cause the light emitting device to fail to operate within its preferred operating tolerances. The present disclosure addresses these and other issues that provides an optical assembly having a light emitting device supported by an optical bench defining an opening below the light emitting device. A heat transfer device may be at least partially disposed in the opening to remove heat from the light emitting device without transferring a significant amount of heat from the light emitting device to the optical bench such that the optical bench remains substantially fixed or at least remains within a preferred range of operating tolerances (i.e., operating temperatures, or operating expansion or contraction ranges based on the CTE of the material forming the bench). The optical assembly may use a thermoelectric module, such as a thermoelectric cooler, operatively connected to temperature control logic or circuitry that instructs the thermoelectric module to either heat or warm the light emitting device to maintain the optical assembly in a set of operating tolerances to maintain the optical bench substantially free from deflections or distortions. Stated otherwise, the present disclosure provides an opto-mechanical mounting scheme that maintains precision positioning orientation for stable beam pointing of a high power laser diode module while still allowing thermal control via conductive path that is mechanically decoupled from a thermal expansion perspective.

In accordance with one aspect, an exemplary embodiment may provide a light emitting assembly comprising: a light emitting device having a first end and a second end defining a first direction therebetween, a first side and a second side defining a second direction therebetween, and a top opposite a bottom defining a vertical direction therebetween; an optical bench supporting the light emitting device; a first thermoelectric module coupled to the light emitting device to heat or cool the light emitting device; a heat exchanger coupled to the thermoelectric module; a temperature sensor coupled to the light emitting device to sense a temperature at portion of the light emitting device; temperature control logic coupled to the temperature sensor; and wherein the first thermoelectric module is in operative communication with the temperature control logic that instructs the first thermoelectric module to heat or cool the light emitting device in response to the temperature sensed by the temperature sensor. This exemplary embodiment or another exemplary embodiment may further provide a light generator in the light emitting device that operates at a maximum efficiency within the temperature operating range and generates heat in response to light generation; wherein the generated heat is sensed by the temperature sensor; instructions sent by the control logic to the thermoelectric module to maintain the light generator of the light emitting device at a temperature that approximates the maximum efficiency. This exemplary embodiment or another exemplary embodiment may further provide instructions sent by the control logic to the thermoelectric module to transmit current in a first direction across the thermoelectric module to heat the light emitting device in response to the temperature sensor determining that the light generator is at a temperature below the temperature of maximum efficiency; and instructions sent by the control logic to the thermoelectric module to transmit current in an opposite second direction across the thermoelectric module to cool the light emitting device in response to the temperature sensor determining that the light generator is at a temperature above the temperature of maximum efficiency. This exemplary embodiment or another exemplary embodiment may further provide a thermal isolator positioned between the optical bench and the light emitting device to isolate and reduce the likelihood that heat transfers directly from the light emitting device to the optical bench as the thermoelectric module heats or cools the light emitting device. This exemplary embodiment or another exemplary embodiment may further provide an opening formed in the optical bench, wherein the thermoelectric module is disposed in the opening. This exemplary embodiment or another exemplary embodiment may further provide a length of the light emitting device that is aligned in the first direction; wherein a majority of the length of the light emitting device is adjacent the opening, wherein the length of the light emitting device is greater than a dimension of the opening aligned in the first direction. This exemplary embodiment or another exemplary embodiment may further provide a sub-element of the heat exchanger disposed adjacent the opening; a fluid conduit defining a hollow bore connected with the sub-element adapted to permit the flow of cooling liquid or cooling gas therethrough. This exemplary embodiment or another exemplary embodiment may further provide a vertically aligned height of the sub-element that is greater than a vertically aligned height of the opening; and a portion of the sub-element that has a length less than the opening and extends through the opening. This exemplary embodiment or another exemplary embodiment may further provide a bottom surface of the light emitting device; wherein the thermoelectric module is directly connected to the bottom surface, and an opening defined in the optical bench is vertically below the bottom surface. This exemplary embodiment or another exemplary embodiment may further provide optics supported by the optical bench adjacent the light emitting device to focus light emitted from the light emitting device; and a fixed relationship of the optics relative to the light emitting device, wherein the optics remain fixed relative to the light emitting device as the light emitting assembly experiences varying external temperatures causing the optical bench to expand or contract based on coefficient of thermal expansion of the optical bench. This exemplary embodiment or another exemplary embodiment may further provide a ratio of length of the light emitting device to length of an opening formed in the optical bench that is at least 5:4. This exemplary embodiment or another exemplary embodiment may further provide a legacy cooling system of a platform; wherein the platform carries the light emitting assembly; and the heat exchanger in operative communication with the legacy cooling system. This exemplary embodiment or another exemplary embodiment may further provide wherein the legacy cooling system includes: an open air communication port on the platform that transfer air from outside the platform into the heat exchanger. This exemplary embodiment or another exemplary embodiment may further provide wherein the legacy cooling system on the platform includes: fluid coolant that flows in a conduit that is tapped into by the heat exchanger to effectuate cooling of the light emitting assembly.

In accordance with another aspect, an exemplary embodiment of the present disclosure may provide a method or process of operating a light emitting assembly comprising: generating a beam of light in a light emitting device mounted to an optical bench; transmitting electrical current through a thermoelectric module coupled to the light emitting device and positioned adjacent an opening defined in the optical bench; transferring heat through the opening in the optical bench; transferring heat relative to a heat exchanger; and maintaining the optical bench in a stable position for stable light beam parameters while temperature changes occur to the optical bench and external environment. Additionally, another embodiment may provide a method comprising: generating a beam of light in a light emitting device mounted to an optical bench; transmitting electrical current through a thermoelectric module coupled to the light emitting device; transferring heat from the light emitting device via the thermoelectric module; transferring heat into a heat exchanger; and maintaining the optical bench in a stable position for stable light beam parameters while temperature changes occur to the optical bench and external environment.

This exemplary method or another exemplary method may further include precluding, with a thermal isolator disposed between the light emitting device and the optical bench, an amount of heat that would alter the beam of light relative to beam optics from transferring from the light emitting device to the optical bench. This exemplary method or another exemplary method may further include transmitting electrical current in a first direction through the thermoelectric module, wherein when current flows in the first direction, the thermoelectric module cools the light emitting device; and transmitting electrical current in a second direction through the thermoelectric module, wherein when current flow in the second direction, the thermoelectric module warms the light emitting device. This exemplary method or another exemplary method may further include transferring heat through a sub-element of the heat exchanger coupled to the thermoelectric module and coupled to a conduit; and flowing fluid through the conduit simultaneous to generating the beam of light. This exemplary method or another exemplary method may further include sensing a temperature of a semiconductor in the light generating device; transmitting the temperature of the semiconductor to temperature control logic coupled with the thermoelectric module; and instructing, by the temperature control logic, the thermoelectric module to heat or cool the semiconductor in response to the sensed temperature.

In accordance with yet another aspect, an exemplary embodiment of the present disclosure may provide a mount that connects a light emitting device, such as a laser diode assembly, to an optical bench. The mount may include a thermoelectrical module coupled to a sub-element of a heat exchanger extending through an opening formed in the optical bench. The thermoelectrical module acts as a heat sink to draw heat outwardly from the laser diode and cool the same. The heat sink enables the laser diode to transmit heat thereto such that substantially all of the heat generated by the laser diode sinks to the heat exchanger. As such, the laser diode transfers virtually no heat to the optical bench so the optical bench is free of deflections or distortions resultant from the heat generated during generation of the laser beam. Additionally, a thermal isolator may be positioned between the light emitting device and the optical bench adapted to reduce an amount of energy from being transferred from the light emitting device to the optical bench during operation thereof in order to prevent the optical bench from distorting due to temperature gradients thus allowing for a stable output beam of light while maintaining the light emitting device at operating temperature.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1:
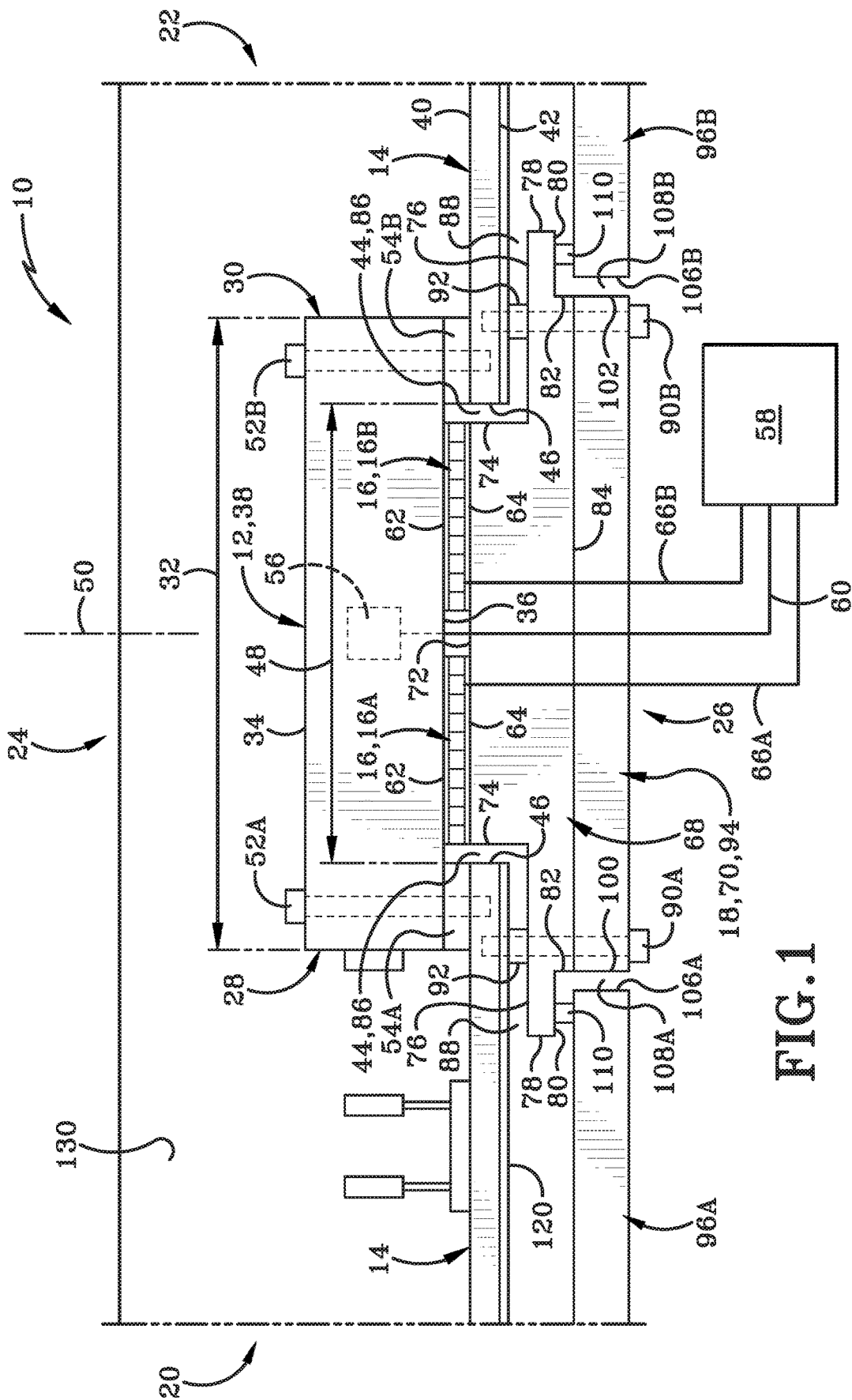
FIG. 1 (FIG. 1) is a diagrammatic side elevation view of a light emitting assembly of the present disclosure having a mount that incorporates a thermoelectric module and thermal isolators to ensure that an optical bench minimally, or does not, deflect or deform during the generation of light.

A light-emitting assembly is depicted throughout the figures generally at 10. The light-emitting assembly 10 includes a light-emitting device 12, an optical bench 14, a thermoelectric module 16, and a heat exchanger 18.

FIG. 1 depicts the light-emitting assembly 10 as having a first end 20 and a second end 22 defining a longitudinal direction therebetween. Light-emitting assembly 10 further includes a top 24 opposite a bottom 26 defining a vertical direction therebetween. The vertical direction is orthogonal to the longitudinal direction. Light-emitting assembly 10 includes a first side opposite a second side defining a transverse direction therebetween. The transverse direction is orthogonal to the longitudinal direction and orthogonal to the vertical direction.

With continued reference to FIG. 1, light-emitting device 12 includes a forward or first end 28 opposite a rear or second end 30. A length 32 of the light-emitting device 12 is oriented in the longitudinal direction and is measured from the first end 28 to the second end 30. Light-emitting device 12 further includes a top surface 34 opposite a bottom surface 36. A height of the light-emitting device 12 is measured from the top 34 to the bottom 36. Light-emitting device 12 further includes an outer surface 38 and an opposing inner surface defining an at least semi-bounded region within which internal components of the light-emitting device 12 are housed. a light generator is in the light emitting device 12 that operates at a maximum efficiency within the temperature operating range and generates heat in response to light generation.

Optical bench 14 includes an upwardly facing top surface 40 opposite a downwardly facing bottom surface 42. Optical bench 14 is a semi-rigid structure or a rigid structure configured to support the light-emitting device 12 thereon. Optical bench 14 defines an opening 44 that is bound by a vertical sidewall 46 established by the thickness of the optical bench 14 as measured between the first surface 40 and the second surface 42. In one particular embodiment, opening 44 may be a circular opening when viewed from above, and in another particular embodiment, when viewed from above, opening 44 may be a rectangular or square opening. A length 48 is measured from sidewall 46 to sidewall 46 through a central vertical axis 50.

Optical bench 14 supports light-emitting device 12 thereon. In one particular embodiment, the light-emitting device 12 may be supported by the upwardly facing top surface 40. Furthermore, the bottom 36 of the outer surface 38 of the light-emitting device 12 may be disposed at a greater vertical height than the upwardly facing top surface 40 of the optical bench 14. Stated otherwise, the bottom 36 may be indirectly coupled to the optical bench 14. As such, the bottom 36 of the outer surface 38 of the light emitting device 12 may not directly contact the optical bench 14.

Light emitting device 12 is positioned substantially centered about the vertical axis 50 over the opening 44. The length 32 of the optical device is greater than the length 48 of the opening 44. A ratio of the length 32 of the optical device 12 relative to the length 48 of the opening 44 may be in a range of about 2:1 to about 10:9. In one particular embodiment, the ratio of the length 32 of the light-emitting device 12 to the length 48 of the opening 44 is about 5:4. In some embodiments, the ratio of lengths may be critical to ensure that heat transfers effectively to the heat exchanger 18 and not transfer into the optical bench 14.

The vertical height of the light-emitting device 12 measured from the top 34 to the bottom 36 may be greater than that of the thickness aligned vertically between the top surface 40 and the bottom surface 42 of the optical bench 14. In one particular embodiment, the vertical height of the light-emitting device 12 is at least three times greater than the thickness of the optical bench 14 measured from the top surface 40 to the bottom surface 42.

A first connector 52A and a first thermal insulator or isolator 54A may be used to couple light-emitting device 12 to the optical bench 14. More particularly, the first thermal isolator 54A is positioned between the upwardly facing top surface 40 of the optical bench 14 and the downwardly facing bottom 36 of the outer surface 38 of the light-emitting device 12. The first thermal isolator 54A is associated with the forward or first end 28 of the light-emitting device 12. Isolator 54A may define a vertically aligned through opening to enable the connector 52A to pass entirely through the vertical opening. The connector 52A may be a threaded connector to threadably connect with optical bench 14. As will be described in greater detail below, first thermal isolator 54A insulates or isolates thermal energy or heat generated by the light-emitting device 12 during the generation of light to insure that heat is not conducted or transferred into the optical bench 14. Accordingly, connector 52A is inserted through the thermal insulator 54A into the optical bench 14 is a thermally non-conductive connector, typically fabricated from a non-conductive material to insure that heat is not inadvertently conducted through the connector 52A into the optical bench 14. A second thermal insulator or isolator 54B is similarly used to space the bottom 36 of the outer surface 38 of the light-emitting device 12 from the upwardly facing top surface 40 of optical bench 14. A second non-thermally conductive connector 52B extends through the light-emitting device 12 and through the second thermal isolator 54B to couple the second or rear end 30 of the light-emitting device 12 to the optical bench 14. In one particular embodiment, the thickness of the first thermal isolator 54A and the thickness of the second thermal isolator 54B are equal to align the laser diode 12 substantially offset parallel to the top surface 40 of the optical bench 14. The first thermal isolator 54A and the second thermal isolator 54B may be fabricated from similar materials or different materials. Furthermore, while FIG. 1 depicts that the leading edge of the first thermal isolator 54A is vertically coplanar with the forward end 28 of the light-emitting device 12, it does not need to be. Similarly, the trailing edge of the first thermal isolator 54A is vertically coplanar with the vertical sidewall 46 defining the opening 44, but it does not need to be. Similarly, the trailing edge of the second thermal isolator 54B is vertically coplanar with the second end 30 of the light-emitting device 12; however, it does not need to be.

By way of non-limiting example, the thermal isolators 54 may be structural thermal break material that provides a combination of low thermal conductivity and high compressive strength and may transfer load in moment and shear conditions, if necessary. Some thermal isolators may support up 40,000 psi and has an R value of 0.9 per inch. The material of the isolator may be made of a reinforced, thermoset resin which can be fire resistant and has very limited creep under load. Alternatively, isolator 54 may be manufactured from a fiberglass-reinforced laminate composite or another similar material that has, in one example, a per-inch R-value of at least 0.56 (BTU/Hr/ft2/in/° F.=1.8). Isolator 54 may maintain structural integrity while minimizing heat transfer. Additionally, isolator 54 may be a silicone based thermal pads ranging in thermal conductivity from about 1.0 W/m-K to about 4.9 W/m-K. For some applications, isolators 54 slightly tacky on one side for generally acceptable adhesion. The tack adhesion strength of the isolator is sufficient for holding the product in place for assembly and use. Isolator 54 may further be formed from ceramic materials. In each instance, the isolator is designed to isolate/prevent energy from being transferred from the light emitting device 12 to the optical bench 14 in order to prevent the bench 14 from distorting due to temperature gradients thus allowing for a stable output beam(s) 122 while maintaining device at needed temperature whether it be heating or cooling the device 12. Namely, temperature gradients are typically formed by the energy and heat generated during the generation of the beam 122, such as a laser beam.

Light-emitting device 12 may further include a temperature sensor 56 disposed within the interior portion of the light-emitting device 12. In one particular embodiment, the light-emitting device 12 is a laser diode. Even further, when the light-emitting device 12 is embodied as a laser diode, the laser diode may be a quantum cascade laser. When the light-emitting device 12 is a quantum cascade laser (QCL), the temperature sensor 56 may be disposed closely adjacent the semiconductors (i.e., the light generator) that are used to emit electromagnetic radiation through the recombination of electron whole pairs across a material band gap. Particularly, semiconductors used to generate and emit electromagnetic radiation operate at a maximum efficiency within a preferred temperature operating range. Thus, the temperature sensor 56 is designed to sense and detect the temperature inside the QCL adjacent the semiconductors that are generating the electromagnetic radiation. Temperature sensor 56 is electrically connected to a control circuit, which may also be referred to as the temperature control logic 58 via an electrical connection 60, which may be wired or wireless. Temperature control logic 58 may include at least one non-transitory computer readable storage medium having instructions encoded thereon that, when executed by a processor, implement operations to heat or cool the light emitting device by sending electrical current through the thermoelectric module 16.

Thermoelectric module 16 may include a top 62 opposite a bottom 64. The top 62 of the thermoelectric module 16 may be coupled to the outer surface 38 at the bottom 36 of the light-emitting device 12. In one particular embodiment, the top 62 of the thermoelectric module 16 may be directly connected to the bottom 36 of the light-emitting device 12. In another particular embodiment, the top 62 may be adhered to the bottom 36 of the outer surface 38 of the light-emitting device 12 via a thermally conductive adhesive.

In one particular embodiment, the thermoelectric module 16 is a first thermoelectric module 16A. A second thermoelectric module 16B may be physically independent and distinct from the first thermoelectric module 16A. The second thermoelectric module 16B may further include a top 62 directly or indirectly connected to the bottom 36 of the outer surface 38 of the light-emitting device 12. The first thermoelectric module 16A may be generally associated with the forward end 28 of the light-emitting device 12 such that it is positioned towards the first end 28 relative to the vertical axis 50. Additionally, the second thermoelectric module 16B may be offset towards the second end 30 such that it is associated therewith and is aligned towards the second end 30 relative to the vertical axis 50. While FIG. 1 depicts that there are two thermoelectric modules 16A, 16B, it is to be clearly understood that the number of thermoelectric modules 16A, 16B utilized in the light-emitting assembly 10 could be varied to meet the needs of a specific application. For example, there may be only a single thermoelectric module 16 or there may be three or more thermoelectric modules 16.

In one particular embodiment, each thermoelectric module 16 may be a thermoelectric cooler (TEC) that uses the Peltier effect to create a heat flux between the junction of two different types of materials. A Peltier cooler, heater, or thermoelectric heat pump is a solid-state active heat pump which transfers heat from one side of the device to the other, which consumption of electric energy, depending upon the direction of the current. Thermoelectric module 16 may be also referred to as a Peltier device, a Peltier heat pump, or a solid-state refrigerator. It can be used either for heating or cooling. It can also be used as a temperature controller that either heats or cools. The first thermoelectric cooler 16A is electrically connected to the temperature control logic 58 via connection 66A, which may be a wired or wireless connection. Similarly, second thermoelectric module 16B is electrically connected to the temperature control logic 58 via connection 66B, which may be a wired or wireless connection.

With continued reference to FIG. 1, heat exchanger 18 may include a sub-element 68 and a conduit 70. Sub-element 68 may further be referred to as a thermal or heat spreader. Sub-element 68 includes a top 72 and a vertical sidewall 74 extending downwardly from the top 72. A horizontal ledge 76 extends radially outward relative to the vertical axis 50 and orthogonal to the sidewall 74. Horizontal ledge 76 terminates at a vertically aligned end wall 78. A lower ledge 80 extends radially inward from the vertical end wall 78 towards the vertical center axis 50. A short vertical sidewall 82 extends downwardly from orthogonal to lower ledge 80. A horizontal bottom 84 extends longitudinally through the vertical axis 50 to a corresponding sidewall 82 on the other end of the sub-element 68. In one particular embodiment, the sub-element 68 may be fabricated from a thermally conducted material, such as aluminum or copper or other metallic or non-metallic thermally conductive materials such as carbon nanoparticles. However, it is to be understood that any thermally conductive material may suffice to fabricate sub-element 68. The top 72 of sub-element 68 is connected with the bottom 64 of each thermoelectric module 16. In one particular embodiment, the top 72 may be directly connected to the bottom 64 of the thermoelectric module and in other embodiments, a thermally conductive interface, such as a metallic foil or a thermally conductive adhesive, may be used to join the sub-element 68 to the thermoelectric module 16. Vertical sidewall 74 extends vertically through the opening 44. The dimension of the sub-element 68 measured from sidewall 74 to sidewall 74 across the axis 50 is less than the dimension of the opening 44. A gap 86 is defined in the opening 44 between the sidewall 74 and the vertical sidewall 46 of the optical bench 14. In one particular embodiment, the gap 86 is uniform and similar on both ends of the opening 44. Furthermore, a longitudinally aligned gap 88 may be defined between the lower surface 42 of the optical bench 14 and the horizontal ledge 76 on the sub-element 68.

Sub-element 68 may be connected to the optical bench 14 via a first connector 90A which may be associated with the first or forward end 20 of the light-emitting assembly 10 positioned forwardly from the vertical axis 50 and a second connector 90B that is rearward of the vertical axis 50. Connectors 90A, 90B may connect to the second surface 42 of optical bench 14. In one particular embodiment, a spacer 92 is utilized to space the horizontal ledge 76 from the lower second surface 42 of the optical bench 14. Particularly, the longitudinal gap 88 is an air gap that purposely separates horizontal ledge 76 on the sub-element 68 from the optical bench 14.

Figure 2:
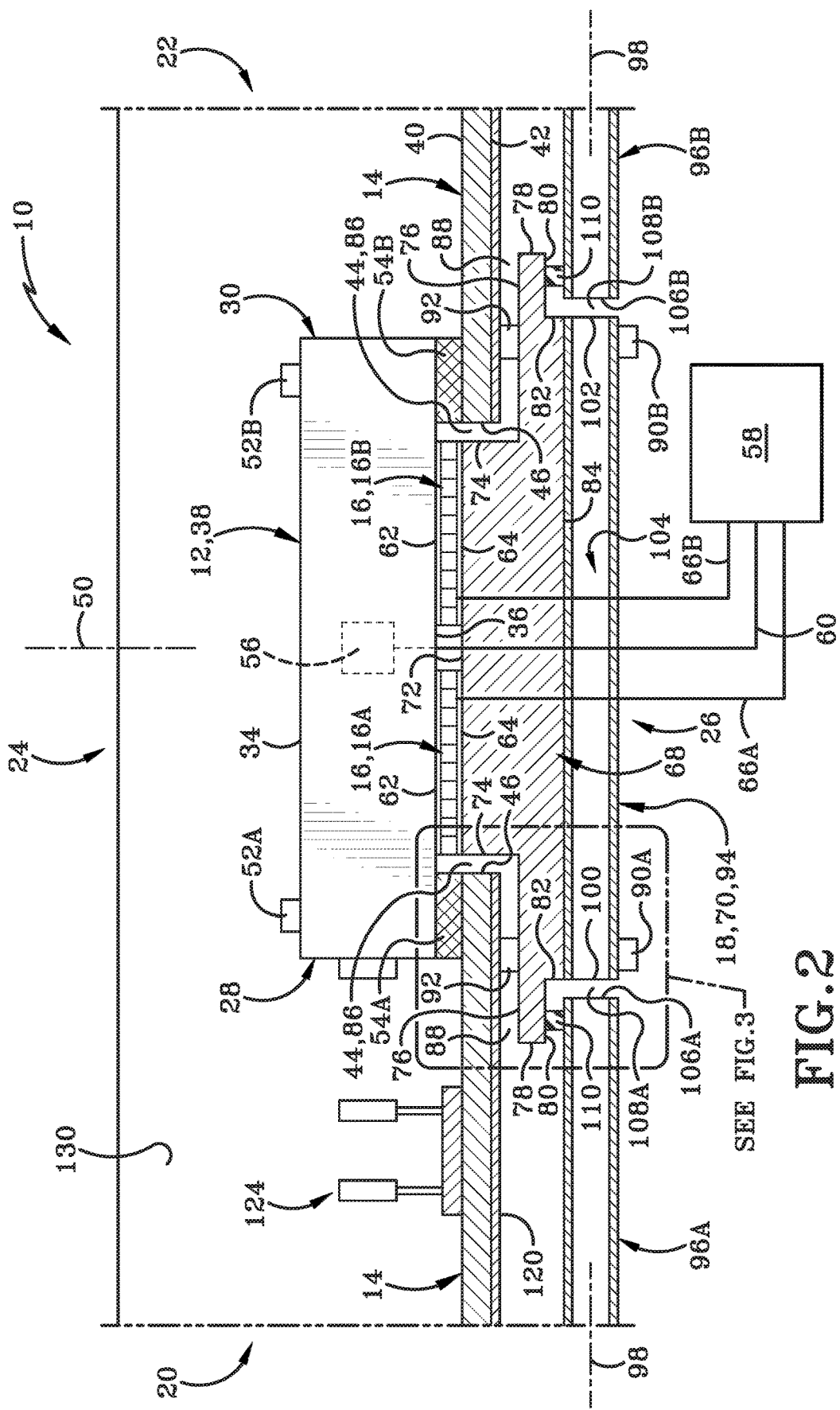
FIG. 2 (FIG. 2) is a cross section view of the optical bench, and portions of a heat exchanger.

FIG. 2 depicts that the conduit 70 may include a central portion 94 that is disposed between end sections of conduit. Namely, a first end section 96A and a second end section 96B of conduit are longitudinally aligned along a conduit axis 98. Central portion 94 of conduit 70 may include a first end 100 and a second end 102. An internal bore or lumen 104 is defined between the first end 100 and the second end 102. The bore 104 extends centrally along longitudinal axis 98. Central portion 94 may be directly or indirectly connected to the bottom 82 of the sub-element 68. The sidewall of the central portion 94 extending between the first end 100 and the second end 102 may be formed from the thermally conductive material, such as metal, and may be directly connected to the bottom 82 of the sub-element 68. Conduit 70, and more particularly the bore 104, is configured to permit a fluid, such as either a liquid or a gas, to flow therethrough along the conduit axis 98. The first end 100 is spaced apart from an end 106A on conduit section 96A to define a gap 108A therebetween. An end 106B on conduit section 96B is spaced apart from the second end 102 of the central portion 94 of conduit 70. Second end 102 and 106B on conduit section 96B define a gap 108B therebetween. The gaps 108A and 108B permit some fluid moving through the bore 104 to exit downwardly and outwardly through the gaps. Thus, in some particular embodiments, not all of the fluid moving through conduit section 96B will progress to conduit section 96A through the central portion 94 due to some fluid being lost downwardly and outwardly through the gaps 108B and 108A.

Figure 3:
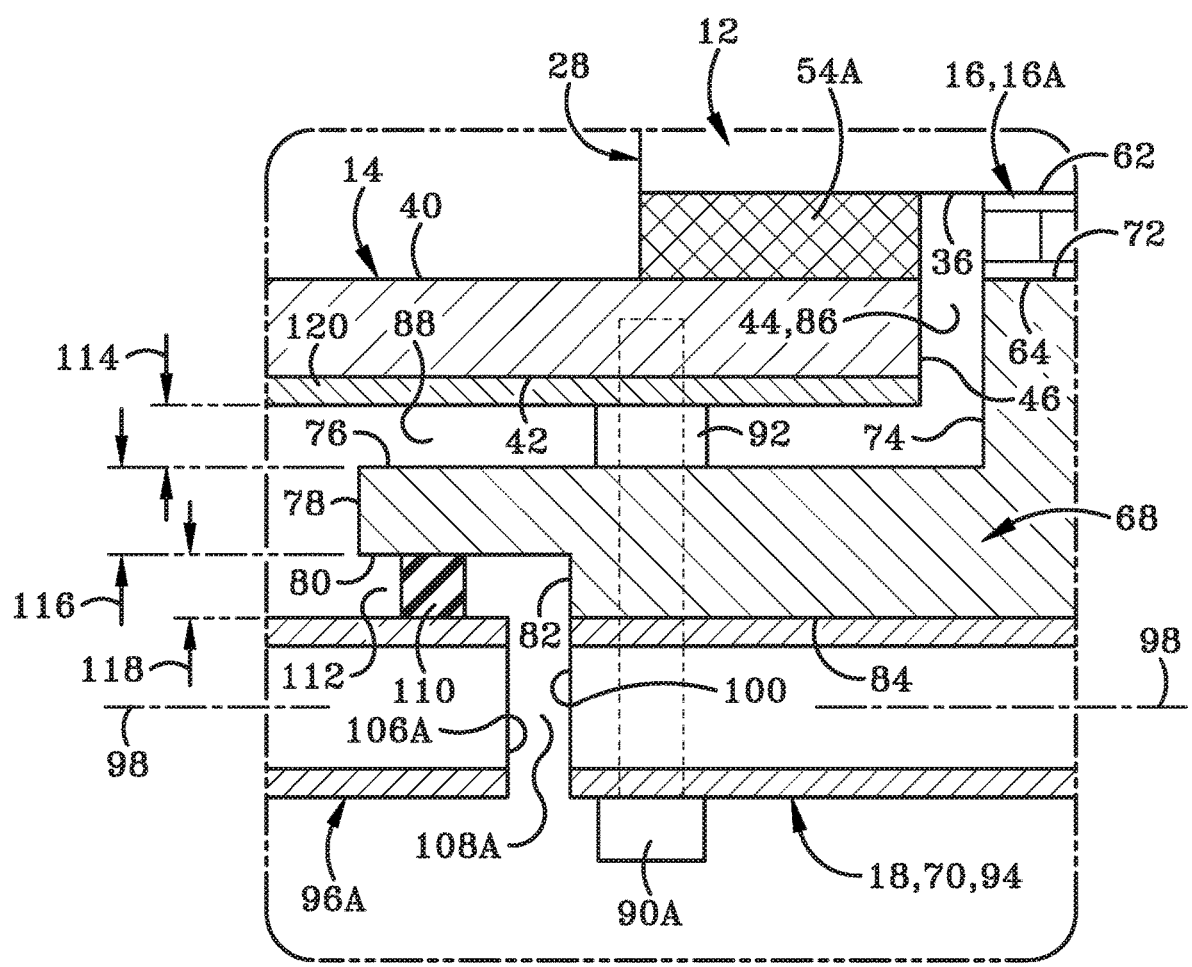
FIG. 3 (FIG. 3) is an enlarged cross section view of the region labeled "SEE FIG. 3" in FIG. 2.

FIG. 3 depicts that a seal 110 is disposed above the first conduit section 96A within a longitudinal gap 112 defined between the lower ledge 80 and the top surface of conduit section 96A. Thus, while fluid moving through bore 104 in central portion 94 can flow outwardly through gap 108A, no fluid movement, such as liquid or gas, may enter the interior portions of the light-emitting assembly 10 because the seal 110 is an O-ring or D-ring that is optically compliant to preclude and prevent any fluids from entering or approaching the light-emitting device 12 inside the light-emitting assembly 10.

With continued reference to FIG. 3, longitudinal gap 88 may be referred to as a first gap or air gap A. Gap 112 may be referred to as a second air gap or air gap B. The vertical dimension 114 associated with air gap A or longitudinal gap 88 is positioned above a second dimension 116 that is associated with the vertical thickness of a portion of the sub-element 68 measured between the ledge 76 and the ledge 80. A third dimension 118 is associated with gap 112 or air gap B. In one particular embodiment, the first dimension 114 and the third dimension 118 are each less than the second dimension 116. In another particular embodiment, the first dimension 114 and the third dimension 118 are equal, and they are both less than the second dimension 116. In another particular embodiment, the second dimension 116 is greater than the first dimension 114 and greater than the third dimension 118, regardless of whether the first dimension 114 and the third dimension 118 are similar. The first dimension 114 corresponds to the size of the spacer 92 disposed in the gap 88. Further, the third dimension 118 corresponds to the height of sidewall 82 and the thickness of the seal 110. Typically, the seal 110 may have a greater dimension than the third dimension 118; however, it is compressed to sealingly engage ledge 80 with the top of conduit section 96A in order to properly hermetically seal the air flow moving therethrough.

In one particular embodiment, optical bench 14 may include an optional bench heater 120 connected to the lower surface 42 of the optical bench 14. The bench heater 120 may define the lower portion of the optical bench 14 that establishes the upper bound of the first dimension 114. Bench heater 120 may be electrically connected to the control logic 58 in order to warm the optical bench 14 from below. When bench heater 120 is connected to the lower surface 42 of optical bench 14, the spacer 92 may directly abut the bench heater 120.

Collectively, the thermoelectric module 16, the sub-element 68 from the heat exchanger 18, the thermal isolators 54A, 54B, the connectors 52A, 52B, and the connectors 90A, 90B may generally be consider a "mount" that attaches the light emitting device 12 to the optical bench. The mount detailed by the aforementioned elements operate in concert to provide an optically stable mount for a high powered light emitting device, such as a QCL. The mount for the QCL may permit thermal contact, via small thermal resistance, between a temperature controlled element (i.e., thermoelectric module 16) and a heat load side of a laser diode package/assembly (i.e., the light emitting device 12). There may be substantial thermal contact between the laser diode (i.e., light emitting device 12) and the heat sink, which may collectively defined by the thermoelectric module 16 and the heat exchanger 18, permit for stable beam parameters while temperature changes occur to the optical bench and the external environment.

Figure 4:
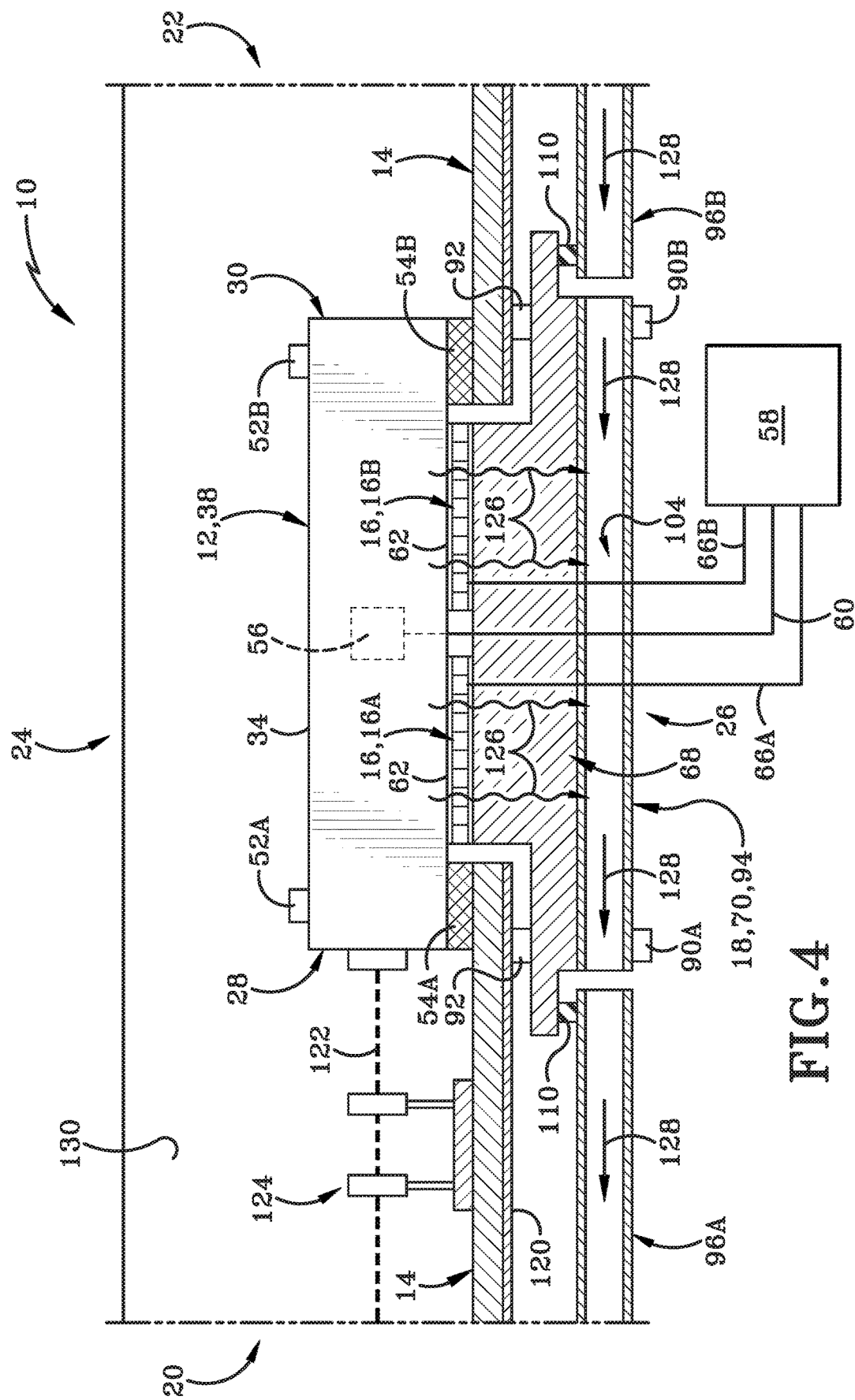
FIG. 4 (FIG. 4) is an operational cross section view similar to FIG. 2.

In operation and with reference to FIG. 4, the light-emitting device 12 may generate a beam of light 122. In one particular embodiment, the beam 122 is a laser beam. Laser beam 122 may be focused through beam optics 124 which are supported by the optical bench 14. Beam optics 124 may focus or steer the beam 122 or may embed the beam 122 with information to be transferred and received by a receiver (not shown). Beam optics 124 are typically positioned forwardly from the forward end 28 of the light-emitting device 12. During the generation of the light beam or laser beam 122, the internal components of the light-emitting device generate heat. Typically, when the light-emitting device 12 is a QCL, the semiconductors are used to generate the laser 122 output heat. However, manufacture of the light-emitting device 12 typically suggests or even require that the light-emitting device 12 be maintained at a preferred operating temperature range in order to maximize efficiency and performance of the light-emitting device 12. Thus, the temperature sensor 56 may detect temperature readings adjacent the components of the light-emitting device 12 that generate the laser beam 122. The temperature sensor 56 may sense the temperature of the internal components of the light-emitting device 12 continuously, selectively, periodically, or randomly. For example, the temperature sensor 56 may continuously monitor the temperature inside the light-emitting device 12 adjacent the semiconductor components generating laser beam 122 when the laser beam 122 is being generated. However, since continuously monitoring of temperature may increase, albeit slightly, power consumption, it may be possible for the temperature sensor 56 to obtain temperature readings of the internal portions of the laser beam device selectively as determined by the temperature control logic 58. Alternatively for example, temperature sensor 56 may obtain temperature readings or detect temperatures of the internal portions of the semiconductors of the light-emitting device 12 at regular intervals such that it is considered intermittently but at certain time periods to reduce overall power consumption in the device. The control logic 58 has instructions sent by the control logic to the thermoelectric module to transmit current in a first direction across the thermoelectric module 16 to heat the light emitting device 12 in response to the temperature sensor 56 determining that the light generator is at a temperature below the temperature of maximum efficiency; and instructions sent by the control logic to the thermoelectric module 16 to transmit current in an opposite second direction across the thermoelectric module 16 to cool the light emitting device in response to the temperature sensor determining that the light generator is at a temperature above the temperature of maximum efficiency.

The heat generated by the internal components of the light-emitting device 12 is transferred to the outer surface 38 of the light-emitting device 12. In one particular embodiment, the heat may be conducted through the outer surface 38 towards the bottom 36 of light-emitting device 12. The thermoelectric modules 16 may be activated by flowing current across the thermoelectric modules 16 in a first direction so as to effectuate the removal of heat from the bottom 36 of the outer surface 38 of the light-emitting device 12. The transfer of heat outwardly of the light-emitting device 12 through the thermoelectric module 16 conductively transfers heat into the sub-element 68. Heat continues to transfer through conduction through the sub-element 68 and into the sidewall of the central portion 94 of the conduit 70. Heat moving into the conduit may be cooled and carried away via the heat exchanger 18 flowing a fluid through the bore 104. The heat being removed from the light-emitting device 12 via the thermoelectric module 16 and flowing through the sub-element 68 is shown generally by arrows 126. The fluid flow through the heat exchanger 18 moving through the bore 104 is indicated by arrows 128. As heat 126 is removed from the light-emitting device 12 and exchanged with heat exchanger 18, the temperature sensor 56 may continue to monitor the temperature within the light-emitting device 12 adjacent the semiconductor components that are used to generate the laser beam 122. As the laser beam 122 generation continues, the temperature sensor 56 determines whether the thermoelectric modules 16 need to continue to operate to continue to cool the light-emitting device 12.

The fluid coolant moving in the direction of the flowing arrows 128 may be effectuated by either a closed system heat exchanger 18 or an open system heat exchanger 18. In a closed system heat exchanger 18, the fluid medium moving through the bore 104 indicated by flow arrows 128 may be recycled and reused to effectuate the cooling of the heat moved via arrows 126. Alternatively, in an open system heat exchanger 18, the fluid medium indicated by flowing arrows 128 may be open to the atmosphere to effectuate the cooling heat being removed via arrows 126 from the light-emitting device 12.

As indicated previously, thermoelectric modules 16 can also be used to heat an item when the current is applied to them in the reverse direction. Thus, if temperature sensor 56 determines that the environment is too cold for the laser to generate laser beam 122 in an efficient manner, the temperature control logic 58 may reverse the current across the thermoelectric module 16 in order to impart heat into the bottom 36 of the light-emitting device 12. This could be used to heat or warm the light-emitting device 12 to raise its temperature if it falls below its preferred optimal temperature operating range.

With continued reference to FIG. 4, the light-emitting device 12 is configured to direct its heat to the surface 38 adjacent the thermoelectric module 16. Accordingly, the light-emitting device 12 is configured to transfer heat through the thermoelectric module 16 and not downwardly into the optical bench 14. Thermal isolators 54A, 54B substantially preclude and prevent heat generated during the generation of laser beam 122 from passing from the light-emitting device 12 to the optical bench 14. Further, the size of the opening 144 effectuates efficient heat transfer to the thermoelectric module 16 as only a small portion of the light-emitting device 12 supported by the optical bench 14 having the thermal isolators 54 disposed between the light-emitting device 12 and the optical bench 14. The isolators 54A, 54B help prevent heat from being transferred into the optical bench 14 because if heat is transferred into the optical bench 14, there is a chance that optical bench 14 can be distorted based on expansion and contraction principles based on the coefficient of thermal expansion of the material used to fabricate the optical bench 14. Thus, it is desirable to preclude thermal expansion or thermal contraction of the optical bench 14 because the beam forming optics 124 have a potential to be distorted if the optical bench 14 expands or contracts.

With continued reference to FIG. 4, when the heat exchanging fluid flowing in the direction of flow arrow 128 is a gas, the seal 110 prevents any gas from entering the internal portions 130 of the light-emitting assembly 10. Some gas may flow outwardly through gaps 108A and 108B such that all the gas does not completely transfer along the bore 104. However, there are other embodiments that provide a direct coupling of the ends of central portion 94 with conduit sections 96A, 96B so all fluid, whether gas or liquid, moving through the bore 104 of the conduit 70 is transferred along the entire length of the conduit 70.

Figure 5:
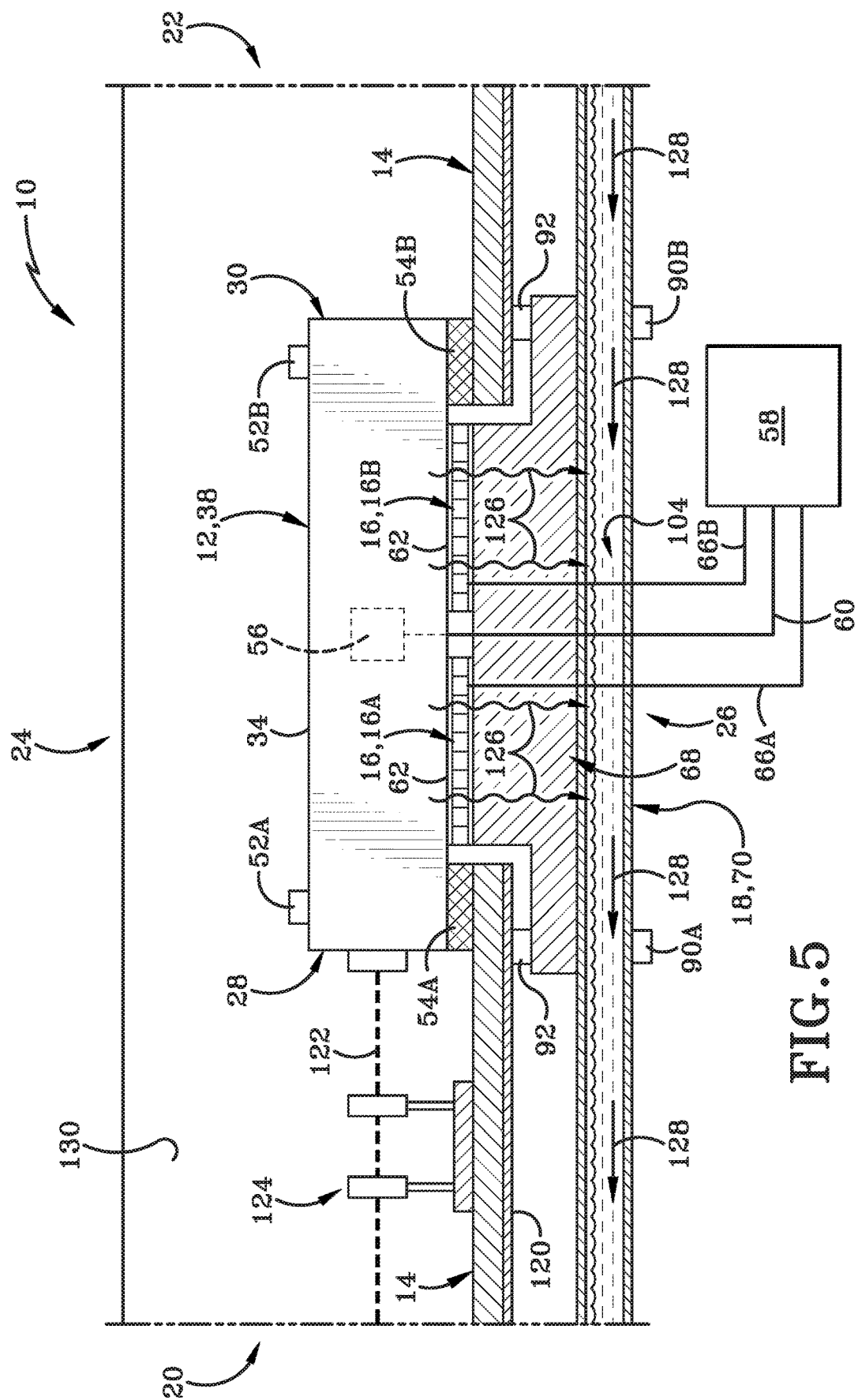
FIG. 5 (FIG. 5) is an operational cross section view of an alternative embodiment in which the heat exchanger provides a closed conduit having liquid coolant flowing therein.

FIG. 5 depicts an operational example in which a liquid coolant is flowing through the bore 104 of the conduit 70 to cool the heat moving via arrows 126. The liquid coolant flows as indicated by arrows 128 along the length of conduit 70. In this particular embodiment, conduit 70 is not broken into sections (such as sections 96A, 96B and central portion 94). Rather, conduit 70 is a continuous length of pipe configured to transfer heat via liquid coolant flowing in the direction of flow arrows 128 through the bore 104. When a solid conduit 70 is utilized, the conduit 70 may be tapped into a legacy heat exchanging system on a platform that carries the light-emitting assembly 10. For example, one exemplary platform is an aerial vehicle, regardless of whether it is manned or unmanned, such as a drone, a fixed wing aircraft, a helicopter, or a satellite. These aerial vehicles or platforms typically include cooling systems are already provided thereon. Thus, the light-emitting assembly 10, and more particularly the heat exchanger 18, may be tapped into a legacy cooling system to borrow the coolant that is used to cool other mechanical or non-mechanical components on the aerial vehicle or aerial platform.

In accordance with one aspect of the present disclosure, the opening 44 or cutout formed in the semi-kinetic optical bench 14 may be shaped to receive the thermoelectric modules 16 therein. In one particular embodiment, the opening 44 may be a square cutout and in another particular embodiment, the opening may be a round cutout. However, other configurations of the opening are entirely possible. Furthermore, it is entirely possible for the thermoelectric modules 16 to be installed within the opening 44, either from above the opening or from below the opening 44 during fabrication of the light-emitting assembly 10. The thermoelectric cooler may be mounted to the light-emitting device 12, which may be a laser diode, in any conventionally known manner that effectuates heat transfer between the light-emitting device 12 and the thermoelectric module. For example, a thermally conductive adhesive may be utilized as an interface between the thermoelectric module 16 and the outer surface 38 of the light-emitting device 12. In another particular embodiment, a thermally conductive foil, such as a metal foil, may be interposed between the thermoelectric module and the outer surface or another surface on the light-emitting device.

The sub-element 68, which may be considered a thermal or heat spreader, can be directly connected with any side of the thermoelectric module. The sub-element 68 may be further connected at an opposite end with a portion of a heat exchanger, such as a heat exchanger conduit. The sub-element 68 may be a piece of material that has high thermal conductivity to occupy or take up the distance between the thermoelectric module and the conduit on the heat exchanger 18. The sub-element 68 helps fill the gap defined by the thickness of the optical bench 14 established by the opening within which the thermoelectric module is disposed. Namely, thermoelectric cooler 16 or the thermoelectric module does not have a great height oriented in the vertical direction. Thus, the sub-element 68 is needed to fill the gap between the thermoelectric module and the conduit 70 on the heat exchanger in order to effectively transfer heat out of the light-emitting device 12 via the thermoelectric module into the heat exchanger. In one particular embodiment, it may be possible to provide a light-emitting assembly 10 that is free of the sub-element 68 if the opening 44 is narrow enough such that the thermoelectric module may be directly connected to a portion of the heat exchanger 18, such as the conduit of the heat exchanger.

In accordance with another aspect of the present disclosure, the heat exchanger 18 may be part of a larger heat exchanging system. The heat exchanging system may be an open heat exchanging system, or a closed heat exchanging system. Alternatively, the fluid used in the heat exchanger 18, namely flowing through the conduit 70, may be either liquid or a gas. In one particular embodiment, the fluid moving through the conduit of the heat exchanger is air that is fed through the conduit. Air that is moving through the conduit may be pumped or may flow naturally as the platform on which the light-emitting assembly 10 is mounted moves through the air or other space. In other embodiments, the fluid that moves through the conduit of the heat exchanger as part of the heat exchanging system may be liquid coolant that is already in existence or part of a legacy cooling system on the platform to which the light-emitting assembly 10 is carried. For example, the event that the light-emitting assembly 10 is supported by an aerial device, regardless of whether the aerial device is manned or unmanned, the aerial device typically has a legacy cooling system used for other elements that need cooled during flight. Accordingly, the conduit on the heat exchanger, or another portion of the heat exchanger, may be tapped into the legacy cooling system on the platform and feed some of the legacy liquid coolant into the conduit 70 of the light-emitting assembly 10. Thus, the light-emitting assembly 10 may be retrofitted to be installed on an existing legacy platform, such as a helicopter, jet, fixed wing aircraft, drone, or any other moveable device.

In one particular embodiment, a portion of the conduit 70 mounted to the sub-element 68 may be spaced apart from another portion of the conduit on the heat exchanger to effectuate and establish a gap (air gap B) therebetween. Thus, the D-ring or O-ring seal must be positioned between the sub-element and the fixed portion of the heat exchanger conduit to effectuate a hermetic seal to insure that air cannot enter the internal space of the light-emitting assembly 10. The light-emitting assembly 10 is compliant with rigid tolerances and parameters of operation ensuring that external dust, air or debris does not degrade the function of the laser diode.

Air gap A minimizes a contact area between the laser diode and the bench. The spacer 92 positioned in air gap A, which may be formed from a ceramic or plastic or another thermally non-conductive material, isolates the light-emitting device 12 such that substantially no heat is transferred from the sub-element 68 into the optical bench 14. Rather the spacer 92 encourages heat to transfer through the thermoelectric module into the heat exchanger 18. Thus, air gap A is a result of the spacer 92 utilized (another thermal isolator). The gap may be an open air gap such that the air itself acts as a thermal insulator due to air's poor heat transfer qualities.

It is to be further understood that while two thermoelectric modules are shown throughout the figures of the present disclosure, it is entirely possible that only a single thermoelectric module could be used, or in the alternative, three or more thermoelectric modules could be used. The number of thermoelectric modules may be varied to fit or optimized to form the desired results of isolating heat away from the optical bench produced by the light-emitting device 12 without departing from the spirit of the present disclosure. Further, while a single sub-element or heat spreader is shown attached to the two thermoelectric modules, it is entirely possible to have multiple heat spreaders connected with the thermoelectric modules. In one particular embodiment, the number of sub-elements or heat spreaders may equal the number of physically distinct and physically independent thermoelectric modules. Thus, while the figures depict two physically separated thermoelectric modules each connected to a single sub-element, it is entirely possible for each thermoelectric module to be coupled to its own independent sub-element. Furthermore, it would be possible to have a single thermoelectric module extending across a majority of the light-emitting device 12 with multiple independent heat spreaders or sub-elements connected thereto in order to draw heat from the thermoelectric module to the heat exchanger. Multiple sub-elements may act like fins on a conventional heat exchanging apparatus.

The heat exchanger fasteners 90A, 90B attach to the bottom of the optical bench 14. The torque required to attach the heat exchanger 18 to the bottom of the optical bench 14 corresponds to the compressive loading force required to operate the thermoelectric module 16. Thus, the thermoelectric module 16 will indicate specifications the compressive loading force required to optimize efficient operation of the thermoelectric module. Once the compressive loading force is determined, a corresponding torque may be applied to the heat exchanger fasteners 90A, 90B to directly cause the sub-element 68 to compress the thermoelectric module 16 as required by its specifications.

In accordance with one aspect of the present disclosure, the light-emitting device 12 may be a laser diode that is part of a laser countermeasure system on an aerial vehicle or platform. Accordingly, the optical bench 14 may be mounted to a portion of the frame or chassis of the aerial vehicle/ platform. In accordance with another aspect of the of the present disclosure, the thermoelectric modules 16 may assist in maintaining the temperature of the light-emitting device 12 within its preferred operating parameters regardless of where the heat source is located. This means that the thermoelectric module 16 can be used to cool the light-emitting device 12 if external heat is applied thereto. For example, it is possible that the moveable platform upon the which the light-emitting assembly 10 of the present disclosure is mounted could exist in a very hot desert climate. Thus, the thermoelectric module 16 could be used to cool the light-emitting device 12 even when a substantial portion of the heat experienced thereby is environmental heat rather than heat generated during the production or generation of light, such as a laser beam. Alternatively, the platform could be operating in very cold environments and the external environmental air may be very cold and the thermoelectric module 16 could be used to warm or heat the light-emitting device 12 to maintain it within its preferred operating temperature range.

The temperature sensor 56 may be mounted in the light-emitting device 12 at a location that is adjacent the internal components generating the light. The temperature sensor 56 is electrically coupled to temperature control logic 58 or a control circuit that directs the thermoelectric module 16 to heat or to cool the light-emitting device 12 in response to signals and data sent by the temperature sensor 56. Thus, it is understood control logic or control circuit may reverse the electrical current to the thermoelectric module 16 to either heat or cool as required. Stated otherwise, for the thermoelectric module 16 to heat the light-emitting device 12, current from the control circuit flows in a first direction. In order for the thermoelectric module 16 to cool the light-emitting device 12, current flows in an opposite second direction across the thermoelectric module 16.

The temperature sensor 56 may be mounted in a QCL near the diode packages that create a wavelength of interest. The diode packages generate heat, thus the temperature sensor 56 must be closely adjacent the diode packages to insure that they operate within their preferred operating temperature range.

In accordance with another aspect of the present disclosure, the sub-element 68 may be formed from a number of materials that are used to efficiently transfer heat between the thermoelectric module 16 and the conduit 70 on the heat exchanger 18. In one particular embodiment, the sub-element 68 may be formed from an aluminum alloy. In another particular embodiment, the sub-element 68 may be formed from copper or another copper alloy. Alternatively, the sub-element 68 could be formed from a graphite composite or any other material that is a good thermal conductor.

The compliant O-ring or D-ring seal 110 assists with the optics to seal the light-emitting device 12 such that no air moving through the heat exchanger 18 does not enter the internal portions of the light-emitting assembly 10 near the internal optics of the light-emitting device 12 and the lens or other optics.

Figure 6:
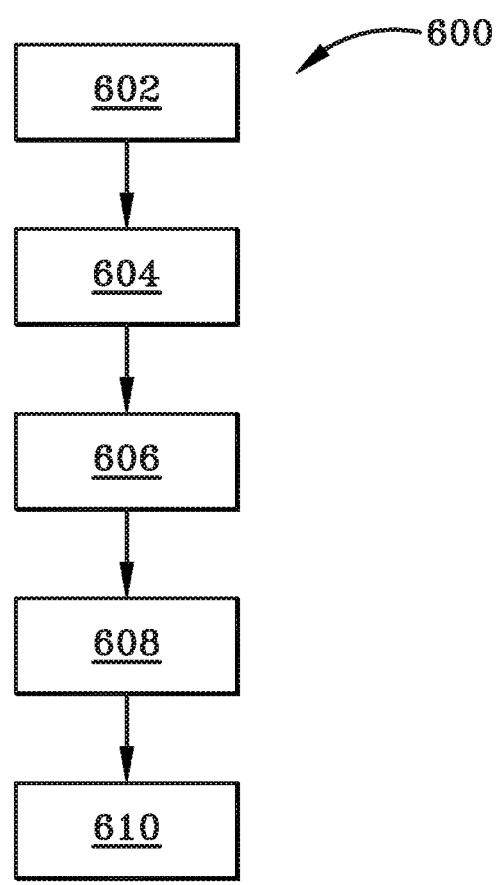
FIG. 6 (FIG. 6) is a flow chart depicting an exemplary method or process in accordance with one aspect of the present disclosure.

FIG. 6 depicts a method or process of operation for the light emitting assembly 10 generally at 600. Method 600 may include generating a beam of light in a light emitting device mounted to an optical bench, which is shown generally at 602. Method 600 may include transmitting electrical current through a thermoelectric module coupled to the light emitting device, which is shown generally at 604. Method 600 may include transferring heat from the light emitting device via the thermoelectric module, which is shown generally at 606. Method 600 may include transferring heat into a heat exchanger, which is shown generally at 608. Method 600 may include maintaining the optical bench in a stable position for stable light beam parameters while temperature changes occur to the optical bench and external environment, which is shown generally at 610.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A light emitting assembly comprising:
   a light emitting device having a first end and a second end defining a first direction therebetween, a first side and a second side defining a second direction therebetween, and a top opposite a bottom defining a vertical direction therebetween;
   an optical bench supporting the light emitting device;
   a thermal isolator to reduce an amount of energy from being transferred from the light emitting device to the optical bench during operation of the light emitting device to reduce a likelihood of the optical bench distorting due to temperature gradients thus allowing for a stable output beam of light while maintaining the light emitting device at an operating temperature;
   a first thermoelectric module coupled to the light emitting device to heat or cool the light emitting device;
   a heat exchanger coupled to the first thermoelectric module;
   a temperature sensor coupled to the light emitting device to sense a temperature at a portion of the light emitting device;
   a temperature control logic coupled to the temperature sensor; and
   wherein the first thermoelectric module is in operative communication with the temperature control logic that instructs the first thermoelectric module to heat or cool the light emitting device in response to the temperature sensed by the temperature sensor.

2. The light emitting assembly of claim 1, further comprising:
   a light generator in the light emitting device that operates at a maximum efficiency within a temperature operating range and generates heat in response to light generation;
   wherein the generated heat is sensed by the temperature sensor; and
   instructions sent by the temperature control logic to the first thermoelectric module to maintain the light generator of the light emitting device at a temperature that approximates the maximum efficiency.

3. The light emitting assembly of claim 2, further comprising:
   instructions sent by the temperature control logic to the first thermoelectric module to transmit current in a first direction across the first thermoelectric module to heat the light emitting device in response to the temperature sensor determining that the light generator is at a temperature below the temperature of maximum efficiency; and
   instructions sent by the temperature control logic to the first thermoelectric module to transmit current in an opposite second direction across the first thermoelectric module to cool the light emitting device in response to the temperature sensor determining that the light generator is at a temperature above the temperature of maximum efficiency.

4. The light emitting assembly of claim 1, further comprising:
an opening formed in the optical bench, wherein the first thermoelectric module is disposed in the opening.

5. The light emitting assembly of claim 4, further comprising:
a length of the light emitting device that is aligned in the first direction; wherein a majority of the length of the light emitting device is adjacent the opening, wherein the length of the light emitting device is greater than a dimension of the opening aligned in the first direction.

6. The light emitting assembly of claim 5, further comprising:
a sub-element of the heat exchanger disposed adjacent an opening formed in the optical bench;
a fluid conduit defining a hollow bore connected with the sub-element adapted to permit flow of cooling liquid or cooling gas therethrough.

7. The light emitting assembly of claim 6, further comprising:
a vertically aligned height of the sub-element that is greater than a vertically aligned height of the opening; and
a portion of the sub-element that has a length less than the opening and extends through the opening.

8. The light emitting assembly of claim 1, further comprising:
a bottom surface of the light emitting device;
wherein the first thermoelectric module is directly connected to the bottom surface, and an opening defined in the optical bench is vertically below the bottom surface.

9. The light emitting assembly of claim 1, further comprising:
optics supported by the optical bench adjacent the light emitting device to focus light emitted from the light emitting device; and
a fixed relationship of the optics relative to the light emitting device, wherein the optics remain fixed relative to the light emitting device as the light emitting assembly experiences varying external temperatures causing the optical bench to expand or contract based on coefficient of thermal expansion of the optical bench.

10. The light emitting assembly of claim 1, further comprising:
a ratio of length of the light emitting device to length of an opening formed in the optical bench that is at least 5:4.

11. The light emitting assembly of claim 1, further comprising:
a legacy cooling system of a platform; wherein the platform carries the light emitting assembly; and
the heat exchanger in operative communication with the legacy cooling system.

12. The light emitting assembly of claim 11, wherein the legacy cooling system includes:
an open air communication port on the platform that transfers air from outside the platform into the heat exchanger.

13. The light emitting assembly of claim 11, wherein the legacy cooling system on the platform includes:
a fluid coolant that flows in a conduit that is tapped into by the heat exchanger to effectuate cooling of the light emitting assembly.

14. A method comprising:
generating a beam of light in a light emitting device mounted to an optical bench;
transmitting electrical current through a thermoelectric module coupled to the light emitting device;
transferring heat from the light emitting device via the thermoelectric module;
transferring heat into a heat exchanger;
maintaining the optical bench in a stable position for stable light beam parameters while temperature changes occur to the optical bench and external environment; and
isolating and preventing energy from being transferred from the light emitting device to the optical bench in order to prevent the optical bench from distorting due to temperature gradients thus allowing for a stable output beam of light while maintaining the light emitting device at operating temperature.

15. The method of claim 14, wherein
isolating and preventing energy from being transferred from the light emitting device to the optical bench includes a thermal isolator disposed between the light emitting device and the optical bench, wherein the thermal isolator prevents an amount of heat that would alter the beam of light relative to beam optics from transferring from the light emitting device to the optical bench.

16. The method of claim 14, further comprising:
transmitting electrical current in a first direction through the thermoelectric module, wherein when current flows in the first direction, the thermoelectric module cools the light emitting device; and
transmitting electrical current in a second direction through the thermoelectric module, wherein when current flow in the second direction, the thermoelectric module warms the light emitting device.

17. The method of claim 14, further comprising:
transferring heat through a sub-element of the heat exchanger coupled to the thermoelectric module and coupled to a conduit;
flowing fluid through the conduit simultaneous to generating the beam of light.

18. The method of claim 14, further comprising:
sensing a temperature of a semiconductor in the light emitting device;
transmitting the temperature of the semiconductor to a temperature control logic coupled with the thermoelectric module;
instructing, by the temperature control logic, the thermoelectric module to heat or cool the semiconductor in response to the sensed temperature.

* * * * *